United States Patent
Osako

(10) Patent No.: US 9,566,774 B2
(45) Date of Patent: Feb. 14, 2017

(54) DISPLAY PANEL MANUFACTURING METHOD AND DISPLAY PANEL

(71) Applicant: JOLED INC., Tokyo (JP)

(72) Inventor: Takashi Osako, Kyoto (JP)

(73) Assignee: JOLED INC., Tokyo (JP)

( * ) Notice: Subject to any disclaimer, the term of this patent is extended or adjusted under 35 U.S.C. 154(b) by 102 days.

(21) Appl. No.: 14/396,211

(22) PCT Filed: Jul. 23, 2013

(86) PCT No.: PCT/JP2013/004487
§ 371 (c)(1),
(2) Date: Oct. 22, 2014

(87) PCT Pub. No.: WO2014/017079
PCT Pub. Date: Jan. 30, 2014

(65) Prior Publication Data
US 2015/0050445 A1    Feb. 19, 2015

(30) Foreign Application Priority Data

Jul. 24, 2012  (JP) ................... 2012-164061

(51) Int. Cl.
*B32B 37/12*     (2006.01)
*H01L 51/52*     (2006.01)
(Continued)

(52) U.S. Cl.
CPC ....... *B32B 37/1284* (2013.01); *B32B 37/0015* (2013.01); *B32B 38/00* (2013.01);
(Continued)

(58) Field of Classification Search
CPC ........................................ B32B 38/00
(Continued)

(56) References Cited

U.S. PATENT DOCUMENTS 8,778,726 B2    7/2014  Zu et al.
2007/0194304 A1  8/2007  Zu et al.
(Continued)

FOREIGN PATENT DOCUMENTS

JP   2002-040443   2/2002
JP   2005-026186   1/2005
(Continued)

OTHER PUBLICATIONS

Search report from PCT/JP2013/004487, mail date is Oct. 22, 2013.

*Primary Examiner* — Brent O'Hern
(74) *Attorney, Agent, or Firm* — Greenblum & Bernstein, P.L.C.

(57) ABSTRACT

A display panel manufacturing method is provided. A display function unit is provided on a surface of a first substrate. Sealing material is provided in a region on the surface of the first substrate that is surrounding the display function unit. Resin is then placed in an inside region of the sealing material over the surface of the first substrate. A total volume amount of the resin placed is greater than a volume capacity of an open space surrounded by the sealing material above the surface of the first substrate. A second substrate is bonded with the first substrate via the sealing material to provide a closed space with the resin being provided in the closed space.

13 Claims, 8 Drawing Sheets

(51) Int. Cl.

| | |
|---|---|
| *B32B 38/00* | (2006.01) |
| *G02F 1/1333* | (2006.01) |
| *H05B 33/04* | (2006.01) |
| *B32B 37/00* | (2006.01) |
| *B32B 37/18* | (2006.01) |

(52) U.S. Cl.
CPC ...... *G02F 1/1333* (2013.01); *G02F 1/133308* (2013.01); *H01L 51/524* (2013.01); *H05B 33/04* (2013.01); *B32B 37/18* (2013.01); *B32B 2037/1253* (2013.01); *B32B 2038/0076* (2013.01); *B32B 2307/40* (2013.01); *B32B 2398/00* (2013.01); *B32B 2457/20* (2013.01); *G02F 2001/133331* (2013.01); *G02F 2201/54* (2013.01); *G02F 2202/28* (2013.01); *Y10T 428/23* (2015.01)

(58) Field of Classification Search
USPC .......................................................... 156/314
See application file for complete search history.

(56) References Cited

U.S. PATENT DOCUMENTS

| | | |
|---|---|---|
| 2009/0096366 A1 | 4/2009 | Kai et al. |
| 2010/0099323 A1 | 4/2010 | Zu et al. |

FOREIGN PATENT DOCUMENTS

| | | | |
|---|---|---|---|
| JP | 2006-179352 | | 7/2006 |
| JP | 2007-227340 | | 9/2007 |
| JP | 2007-233117 | | 9/2007 |
| JP | 2009-099303 | | 5/2009 |
| JP | 2009099303 A | * | 5/2009 |
| JP | 2011-113808 | | 6/2011 |

* cited by examiner

DISPLAY PANEL MANUFACTURING METHOD AND DISPLAY PANEL

TECHNICAL FIELD

The present invention relates to display panels, and particularly relates to a highly-productive display panel manufacturing method, and a display panel manufactured by such a manufacturing method.

BACKGROUND ART

Conventionally, a variety of display panels each include a display unit that is sealed by two substrates facing each other via a sealing material have been put into practical use. Examples of such display panels include an organic electroluminescence (EL) display panel having organic electroluminescence elements in the display unit, and a liquid crystal display panel having liquid crystal elements in the display unit.

Patent Literature (PTL) 1 discloses an organic EL display device (display panel) in which an element substrate on which organic EL layers are formed is sealed by a sealing substrate via a sealing portion. In the organic EL display device, sealing the element substrate by the sealing substrate at a pressure higher than the atmospheric pressure causes both the element substrate and the sealing substrate to curve so as to be outwardly convex (in other words, the display panel expands) under the atmospheric pressure. Such a curved shape of the above organic EL display device can prevent deterioration of the elements due to an external pressure.

PTL 2 discloses an organic EL device including: a seal member having at least one sealing port and arranged between an array substrate and a sealing substrate; and a resin layer arranged inside the seal member. In the aforementioned organic EL device, an excess resin inside the seal member is discharged from the sealing port when sealing is performed. Such a sealing port in the aforementioned organic EL device reduces a load applied to the seal member, thereby preventing breakdown of the seal member.

CITATION LIST

Patent Literature

[PTL 1] Unexamined Japanese Patent Publication No. 2009-99303
[PTL 2] Unexamined Japanese Patent Publication No. 2011-113808

SUMMARY OF INVENTION

Technical Problem

However, in a display panel including a display unit sealed by two substrates facing each other via a sealing material, the two substrates after being sealed sometimes curve in the same direction (in other words, one substrate becomes outwardly convex, and the other substrate becomes inwardly convex). This may cause the display panel to be warped.

The present invention is conceived in view of the above situation, and provides a display panel manufacturing method that is made highly productive by taking a measure against warp of a display panel, and a display panel manufactured by such a manufacturing method.

Solution to Problem

In order to solve the aforementioned problem, an aspect of the disclosed display panel manufacturing method includes: preparing a first substrate having a main surface on a part of which a display function unit is formed; forming a sealing material in a region surrounding the display function unit of the main surface of the first substrate; placing a resin in an inside region of the sealing material on the main surface of the first substrate, the resin being placed in an amount that is greater than a capacity of an open space surrounded by the sealing material above the main surface of the first substrate;

and bonding the first substrate and a second substrate via the sealing material.

It should be noted that this general or specific aspect may be realized in the display panel manufactured by the above manufacturing method.

Advantageous Effects of Invention

According to the display panel manufacturing method, a closed space surrounded by the first substrate, the sealing material, and the second substrate are filled with the resin in an amount that is greater than the capacity of the open space, and thus a positive pressure can be applied to the closed space. The positive pressure works as a force in a direction that reduces warp of the display panel, and thus the warp of the display panel is reduced. As a result, a highly-productive display panel manufacturing method can be implemented.

DESCRIPTION OF EMBODIMENTS

Underlying Knowledge Forming Basis of the Present Invention

The inventor of the present invention has studied warp of a display panel and conceived the present invention. The following firstly describes the warp of a display panel, and then describes aspects of the present invention.

Figure 1:
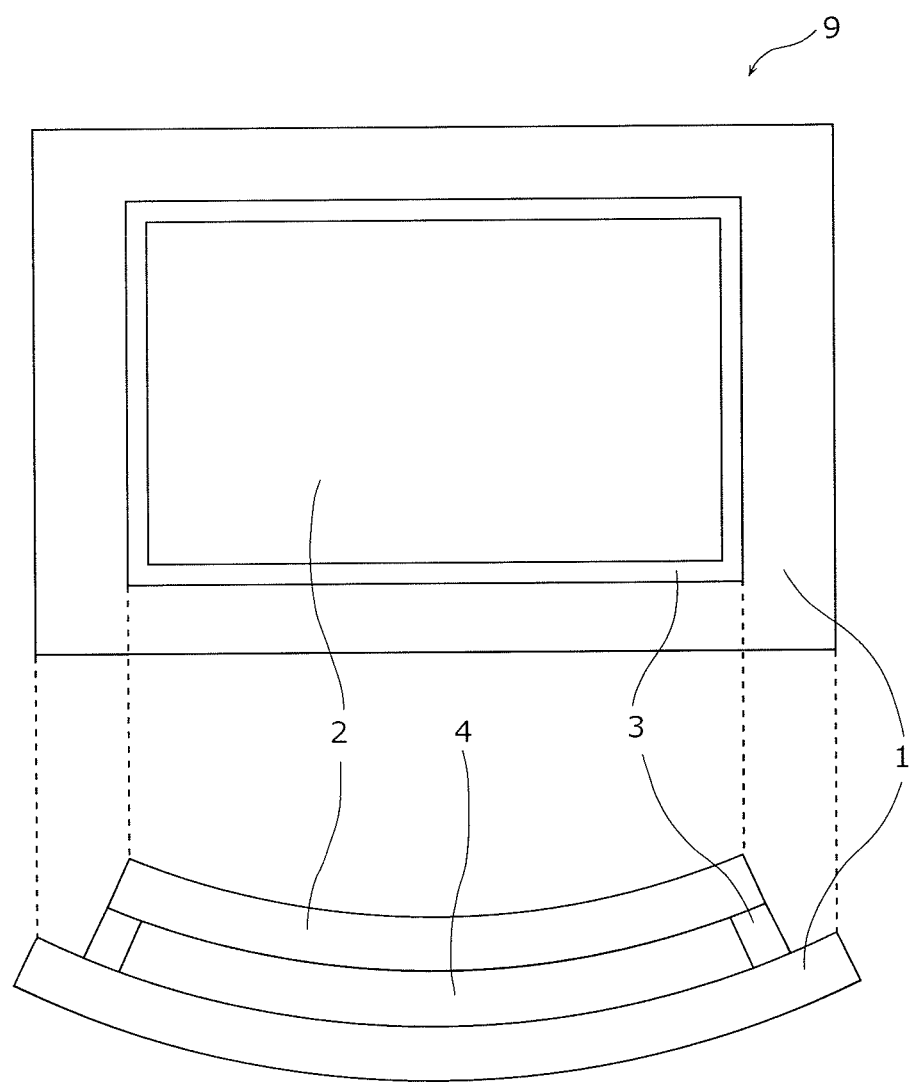
FIG. 1 is a diagram illustrating an example of a shape of a display panel according to a comparison.

FIG. 1 is a diagram illustrating an example of a warped shape of a display panel 9 as a comparison. The display panel 9 is formed by bonding a substrate 1 and a substrate 2 which face each other via a sealing material 3. Here, the substrates 1 and 2 are bonded by a resin 4 that is curable and that is filled between the substrates 1 and 2.

The substrate 1 may be a main substrate on which pixel units each including a thin-film transistor, an organic EL element, and so on, are arranged, for example. The substrate 2 may be a filter substrate on which each color filter is disposed in a position facing a corresponding one of the pixel units, for example.

In ordinary conventional techniques, the amount of the resin 4 filled in is equal to or less than a capacity of the closed space defined by the surrounding substrate 1, substrate 2, and sealing material 3. This is because using too much resin 4 increases a danger of breaking the sealing material 3, whereas using less resin 4 generates a negative pressure in the closed space, and thus a sealing effect is expected to increase.

Unfortunately, the present inventor experienced a situation that the display panel 9 which is manufactured by a conventional manufacturing method was warped and a problem in processing occurred in a subsequent step. In the conventional manufacturing method, the resin 4 was used in an amount equal to or less than the capacity. Specifically, the problem occurred was an error of suctioning by a stage in a step of attaching an anisotropic conductive film for wire connection on a periphery of the display panel, due to the warp. At this time, the periphery of the display panel rose approximately 0.5 mm from the stage.

The present inventor has studied the warp of the display panel 9 first as described below while considering a measure against such a problem.

Figure 2A:
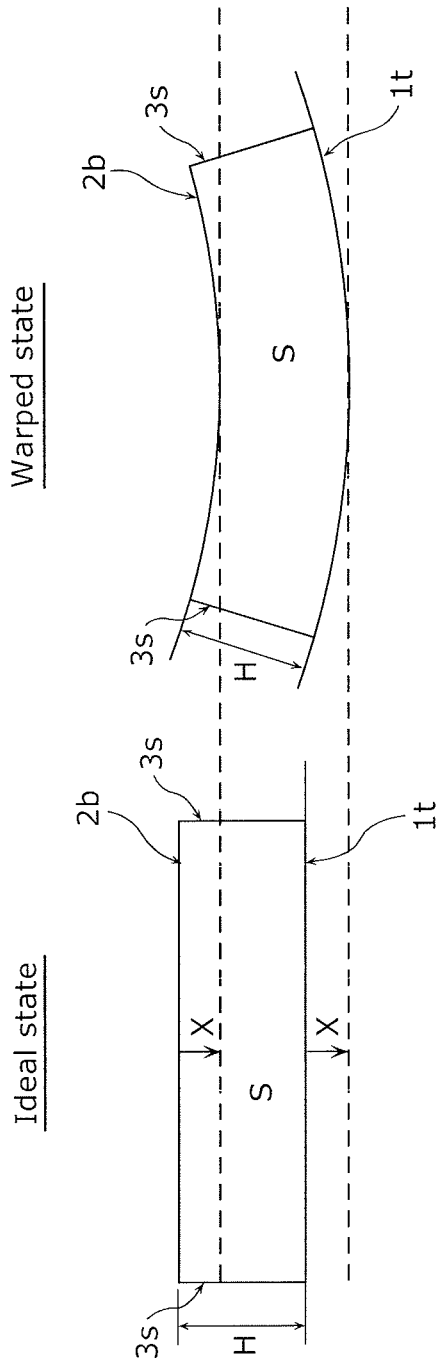
FIG. 2A is a schematic cross-sectional view for illustrating warp of substrates.

FIG. 2A is a schematic cross-sectional view for illustrating warp of substrates.

In FIG. 2A, a surface 1$t$ and a surface 2$b$ are main surfaces of the substrate 1 and the substrate 2, respectively, and the surfaces 1$t$ and 2$b$ face each other. A surface 3$s$ is a side surface of the sealing material 3. Since FIG. 2A is a cross-sectional view, the surfaces 1$t$, 2$b$, and 3$s$ are illustrated by lines. It should be noted that main bodies of the respective substrate 1, the substrate 2, and the sealing material 3 are not illustrated in FIG. 2A.

The substrate 1 and the substrate 2 are flat (ideal state) before the resin 4 is cured. However, the substrate 1 and the substrate 2 are stressed in a direction that the resin 4 shrinks when the resin 4 is being cured, and the substrate 1 and the substrate 2 are warped (warped state) after the resin 4 is cured. The reference sign X indicates a warped amount of one of the substrate 1 and the substrate 2, S indicates a cross-sectional area of the resin 4, and H indicates a height of the sealing material 3.

Here, according to Hooke's law, $\sigma = E \times \epsilon$ ($\sigma$: stress, E: modulus of elasticity, $\epsilon$: strain), and since $\sigma = F/A$, the strain $\epsilon = F/(A \times E)$ (F: shrinking force, A: cross-sectional area=thickness×width).

When the shrinking force F is applied to both the first substrate 1 and the second substrate 2 and the first substrate 1 and the second substrate 2 are made of the same material (for example, the same kind of glass), the modulus of elasticity E and the thickness of the substrates are the same, and thus the strain $\epsilon \propto 1/\text{width}$. In other words, a substrate having a larger width (length) is strained less.

Therefore, the strained amount of the second substrate 2 is greater than that of the first substrate 1, and the display panel 9 is pulled by the strain of the second substrate 2, and thus the display panel 9 is warped so as to be downwardly convex.

Accordingly, the present inventor has considered using an increased amount of the resin 4 to reduce such strain.

Figure 2B:
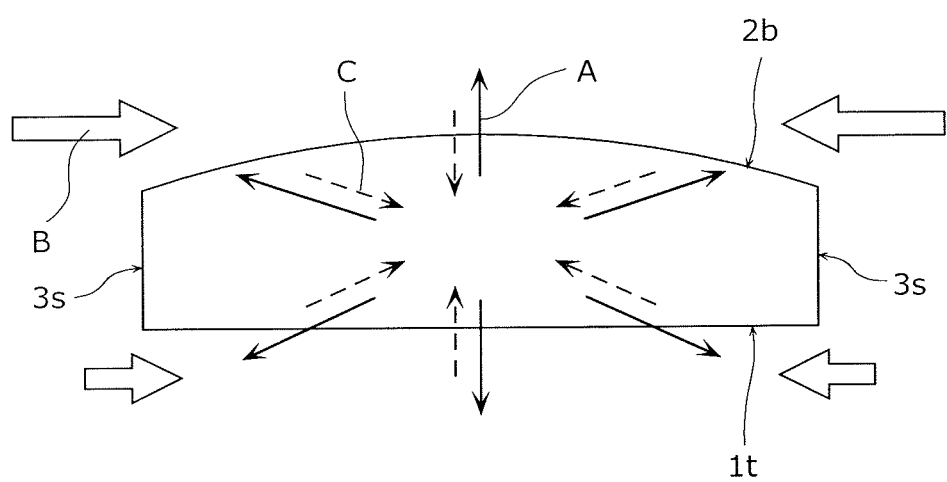
FIG. 2B is a cross-sectional view schematically illustrating a stress applied when an increased amount of a resin is used.

FIG. 2B is a cross-sectional view schematically illustrating the stress applied when an increased amount of the resin 4 is used. FIG. 2B is illustrated using the same reference signs as in FIG. 2A.

The following two kinds of forces are considered to be generated when an increased amount of the resin 4 is used: (i) outward forces A caused by the resin 4 that is compressed due to the increased amount, and (ii) inward forces C caused by forces B that occur in a direction that the first substrate 1 and the second substrate 2 tend to curve. Generally, the outward forces A are assumed to be stronger than the inward forces C caused by the forces B. In other words, the warp of the display panel is expected to be recued by using an increased amount of the resin 4.

In view of the problem of the warp of the conventional display panels and the aforementioned studies, the following discloses several aspects of a display panel manufacturing method that is made highly productive by taking a measure against warp of a display panel, and a display panel manufactured by the manufacturing method.

An aspect of the display panel manufacturing method according to the present disclosure includes: preparing a first substrate having a main surface on a part of which a display function unit is formed; forming a sealing material in a region surrounding the display function unit of the main surface of the first substrate; placing a resin in an inside region of the sealing material on the main surface of the first substrate, the resin being placed in an amount that is greater than a capacity of an open space surrounded by the sealing material above the main surface of the first substrate; and bonding the first substrate and a second substrate via the sealing material.

According to this aspect, a closed space surrounded by the first substrate, the sealing material, and the second substrate is filled with the resin in an amount that is greater than the capacity of the open space, and thus a positive pressure can be applied to the closed space. The positive pressure works as a force in a direction that reduces warp of the display panel, and thus the warp of the display panel is reduced. As a result, a highly-productive display panel manufacturing method is implemented.

In an aspect of the display panel manufacturing method according to the present disclosure, in the placing of a resin, the capacity of the open space may be obtained by subtracting a volume of the display function unit from a volume obtained by multiplying an area of the region surrounded by the sealing material on the main surface of the first substrate by a height of the sealing material.

According to this aspect, the amount of the resin to be placed can be specifically estimated.

In an aspect of the display panel manufacturing method according to the present disclosure, in the preparing of a first substrate, either (i) a plurality of thin film transistors (TFTs) and a plurality of display elements or (ii) a plurality of color filters may be formed on the main surface of the first substrate as the display function unit.

According to this aspect, the first substrate can be configured as a main substrate or a color filter substrate of the display panel.

An aspect of the display panel manufacturing method according to the present disclosure may further include: holding one of the first substrate and the second substrate level by a plurality of holding units after the bonding of the first substrate and the second substrate; and curing the resin placed, in a state where the one of the first substrate and the second substrate is being held level.

According to this aspect, the resin placed is cured in a state where the one of the first substrate and the second substrate is being held level, and thus further warp of the display panel that progresses as the resin is being cured can be suppressed.

In an aspect of the display panel manufacturing method according to the present disclosure, in the holding of one of the first substrate and the second substrate level, the one of the first substrate and the second substrate may be held by a greater number of the plurality of holding units at a periphery than at a center of the one of the first substrate and the second substrate.

According to this aspect, one of the first substrate and the second substrate is held more firmly, and thus further warp of the display panel that progresses as the resin is being cured can be suppressed.

In an aspect of the display panel manufacturing method according to the present disclosure, in the placing of a resin, the amount of the resin to be placed may be greater than the capacity of the open space by not more than six times.

According to this aspect, warp of the display panel can be reduced without increasing the danger of breaking the sealing material 3.

In an aspect of the display panel manufacturing method according to the present disclosure, in the placing of a resin, the resin may be placed by being dropped on the inside region of the sealing material on the main surface of the first substrate.

According to this aspect, the resin may be placed, for example, by applying the resin by a dispenser or dropping the resin by an inkjet process.

In an aspect of the display panel manufacturing method according to the present disclosure, in the placing of a resin, a greater amount of the resin may be placed at a center than at a periphery of the first substrate.

According to this aspect, the second substrate is placed above the first substrate while the second substrate spreads the resin at the center of the first substrate to the periphery. As a result, a void where the resin is not filled in is less likely to remain in the closed space surrounded by the first substrate, the sealing material, and the second substrate.

An aspect of the display panel manufacturing method according to the present disclosure may include: fixing the second substrate in a predetermined position relative to the first substrate after the second substrate is placed.

According to this aspect, the resin can be cured while misalignment of the second substrate with respect to the first substrate is prevented.

In an aspect of the display panel manufacturing method according to the present disclosure, in the forming of a sealing material, an other sealing material may be formed at an outer periphery of the sealing material.

According to this aspect, a more improved sealing effect can be obtained.

An aspect of a display panel according to the present disclosure includes: a first substrate which is flat; a display function unit formed on a main surface of the first substrate; a sealing material formed in a region surrounding the display function unit of the main surface of the first substrate; a second substrate placed on the sealing material; and a resin filled in a space surrounded by the first substrate, the sealing material, and the second substrate, in which a distance between the first substrate and the second substrate is greater at a center than at a periphery of the first substrate.

According to this aspect, a positive pressure can be applied to the closed space surrounded by the first substrate, the sealing material, and the second substrate. The positive pressure works as a force in a direction that reduces warp of the display panel, and thus the warp of the display panel is reduced. As a result, a display panel that can be manufactured with high productivity is obtained.

Embodiment

The following describes in detail the display panel manufacturing method and the display panel according to Embodiment with reference to the drawings.

It should be noted that the embodiment described below shows a specific example of the present invention. The values, shapes, materials, structural components, layout and connection of the structural components, steps, the order of the steps, and so on in the following embodiment are mere examples, and are not intended to limit the scope of the present invention. Among the structural components in the following embodiment, structural components not recited in any one of the independent claims which indicate the broadest concepts of the present invention are described as optional structural components. Moreover, the drawings schematically illustrate each of the structural components for easier comprehension, and thus the shapes, sizes, and so on are not necessarily exact depictions.

Figure 3:
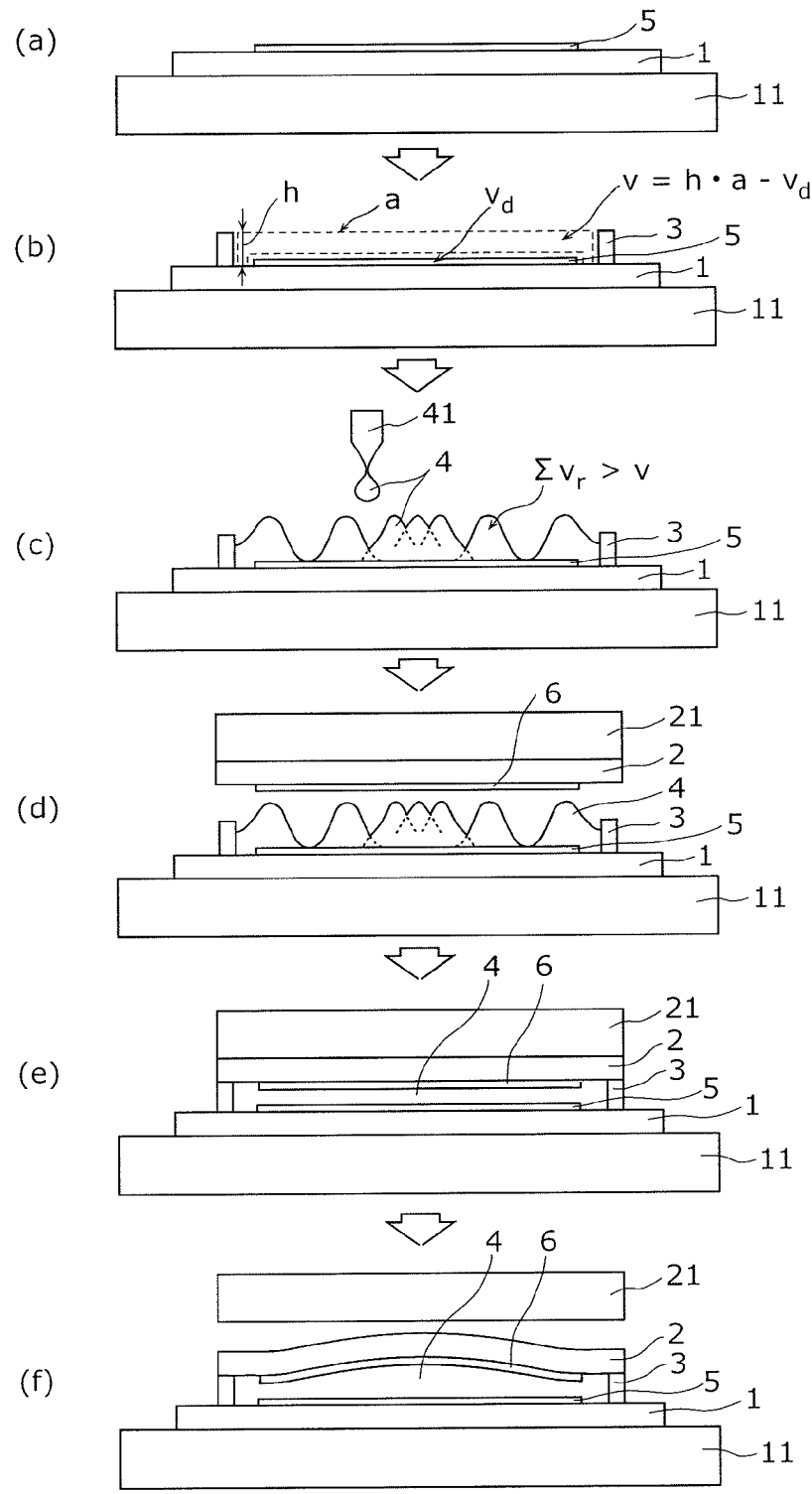
FIG. 3 is a process chart illustrating, in (a) to (f), an example of a process of a display panel manufacturing method according to Embodiment.

In FIG. 3, (a) to (f) are cross-sectional views illustrating an example of a process of the manufacturing method of a display panel according to Embodiment.

This manufacturing method includes: preparing a substrate 1 having a main surface on a part of which a display function unit 5 is formed ((a) in FIG. 3); forming a sealing material 3 in a region surrounding the display function unit 5 of the main surface of the substrate 1 ((b) in FIG. 3); placing a resin 4 in an inside region of the sealing material 3 on the main surface of the substrate 1, the resin being placed in an amount that is greater than a capacity of an open space surrounded by the sealing material 3 above the main surface of the substrate 1 ((c) in FIG. 3); and bonding the substrate 1 and a substrate 2 via the sealing material 3 ((e) in FIG. 3).

Here, the substrate 1 and the substrate 2 are examples of the first substrate and the second substrate, respectively.

In the preparing of the substrate 1, the display function unit 5, in which a plurality of pixel units are arranged, is formed on the main surface of the substrate 1 that is, for example, made of glass. Each of the pixel units includes a thin film transistor (TFT) and a display element, for example. With this, the substrate 1 is configured as the main substrate of the display panel ((a) in FIG. 3).

The substrate 1 is held level on a suction stage 11. The substrate 1 may be held by a greater number of the holding units at a periphery than at a center of the substrate 1. Therefore, for example, the suction stage 11 may have more vacuum holes (not illustrated in the drawings) in a region where the suction stage 11 holds the periphery of the substrate 1 than in a region where the suction stage 11 holds the center of the substrate 1.

In the forming of the sealing material 3, the sealing material 3 is formed in a region surrounding the display function unit 5 of the substrate 1, thereby forming, above the main surface of the substrate 1, an open space having an open top and sides surrounded by the sealing material 3.

A capacity v of the open space is expressed by $h \cdot a - v_d$, where $h \cdot a$ is the volume obtained by multiplying an area a of a region of the main surface of the substrate 1 surrounded by the sealing material 3 by a height h of the sealing material 3, $v_d$ is the volume of a part of the display function unit 5 located higher than a bottom end of the sealing material 3, and $v_d$ is subtracted from $h \cdot a$ ((b) in FIG. 3).

In the placing of the resin 4, the resin 4 is placed in an amount $\Sigma v_r$ that is greater than the capacity v of the open space in the inside region of the sealing material 3 on the main surface of the substrate 1. The resin 4 may be placed, for example, by being discharged from a nozzle 41 and dropped in the inside region. Moreover, a greater amount of the resin 4 may be placed at a center than at a periphery of the substrate 1 ((c) in FIG. 3).

Furthermore, although not illustrated in the drawings, in preparing of the substrate 2, on the main surface of the substrate 2 that is, for example, made of glass, a display function unit 6 in which a plurality of color filters are arranged is formed, for example. In this way, the substrate 2 is configured as a color filter substrate of the display panel.

In the bonding of the substrate 1 and the substrate 2, for example, the substrate 2 is held by an upper substrate stage such as a suction chuck 21 in such a way that the display function unit 6 faces the substrate 1, and carried above the substrate 1 ((d) in FIG. 3).

Subsequently, each of the color filters of the display function unit 6 are aligned with a corresponding one of the pixel units of the display function unit 5, and the substrate 2 is placed on the resin 4 and the sealing material 3 ((e) in FIG. 3). The substrate 2 is placed on the resin 4 and the sealing material 3 in a vacuum. Subsequently, after the substrate 1 and the substrate 2 are exposed to the atmospheric pressure or while the substrate 1 and the substrate 2 are gradually being exposed to the atmospheric pressure, the upper substrate stage is removed from the substrate 2 ((f) in FIG. 3). By doing so, the substrates 1 and 2 as a whole are pressed down by returned air pressure.

The placed substrate 2 becomes outwardly convex where the air pressure and the repulsive force of the resin 4 caused by being pressed down by the air pressure are balanced. Therefore, the closed space surrounded by the substrate 1, the sealing material 3, and the substrate 2 is filled with the resin 4 in an amount that is greater than the capacity of the open space.

After the substrate 2 is placed, the substrate 2 may be fixed, for example, at least until the resin 4 starts to be cured, in a predetermined position relative to the substrate 1, that is, a position where each of the color filters and a corresponding one of the pixel units are correctly aligned with each other.

After the resin 4 is cured, the display panel according to Embodiment is completed.

Figure 4:
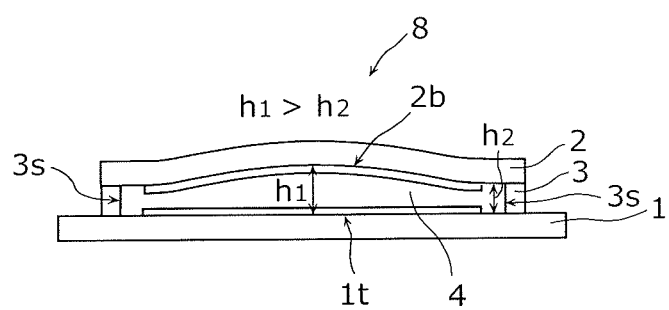
FIG. 4 is a diagram illustrating an example of a cross-sectional shape of a display panel according to Embodiment.

FIG. 4 is a diagram illustrating an example of a cross-sectional shape of a completed display panel 8.

The display panel 8 includes: the substrate 1 which is flat; a display function unit formed on a main surface of the substrate 1; the sealing material 3 formed in a region surrounding the display function unit on the main surface of the substrate 1; the substrate 2 placed on the sealing material 3; and the resin 4 filled in a space surrounded by the first substrate, the sealing material 3, and the substrate 2, in which a distance $h_1$ which is a distance between the substrate 1 and the substrate 2 at a center of a region surrounded by the sealing material 3 is greater than a distance $h_2$ which is a distance between the substrate 1 and the substrate 2 at a periphery of the region.

The present inventor conducted an experiment on actually creating the display panel 8 having such a shape. In this experiment, the sealing material 3 was formed to a height of 6 μm from the substrate 1, and then the resin 4 was placed in the region surrounded by the sealing material 3 on the main surface of the substrate 1.

As described above, according to the configuration of the display panel 8, too much resin 4 may break the sealing material 3. Accordingly, the resin 4 was placed to have a height that exceeds the upper surface of the sealing material 3 owing to the viscosity of the resin 4, and the behavior of the sealing material 3 was observed. As a result, when the resin 4 was placed to the height that exceeds the upper surface of the sealing material 3, the present inventor confirmed that the sealing material 3 did not break until the amount of the resin 4 was increased to approximately six times greater than the capacity of the aforementioned open space. The present inventor also confirmed that the completed display panel 8 was not warped (in other words, the periphery did not rise from the stage).

From this result, the amount of the resin 4 to be placed may be more than the capacity of the open space by not more than six times, for example.

Moreover, in the bonding of the substrate 1 and the substrate 2, when the resin 4 does not spread evenly to the periphery of the substrate 1, the thickness of the resin 4 becomes greatly uneven in an outer peripheral area of the display function unit 5. This leads to uneven interference to occur in a part of the display function unit 5 near the periphery.

In order to suppress such uneven interference, for example, the resin 4 may be discharged from the nozzle 41 to place a greater amount of the resin 4 at the periphery of the substrate 1. By doing so, the resin 4 is spread to the periphery of the substrate 1, thereby suppressing the occurrence of the greatly-uneven thickness and the uneven interference in the display function unit 5 near the periphery. In this case too, placing the resin 4 in an amount that is greater than the capacity v of the open space allows the resin 4 to be evenly spread to the periphery of the substrate 1.

The foregoing has described a display panel manufacturing method and a display panel manufactured by such a manufacturing method according to an aspect of the invention based on Embodiment. However, the present invention is not limited to Embodiment above. Various modifications to Embodiment that may be conceived by those skilled in the art and combinations of structural components in different embodiments may be included within the scope of one or more aspects of the present invention, as long as the modifications and combinations do not depart from the spirit of the present invention.

For example, in Modification 1, two sealing materials are placed to further improve the sealing effect.

Figure 5:
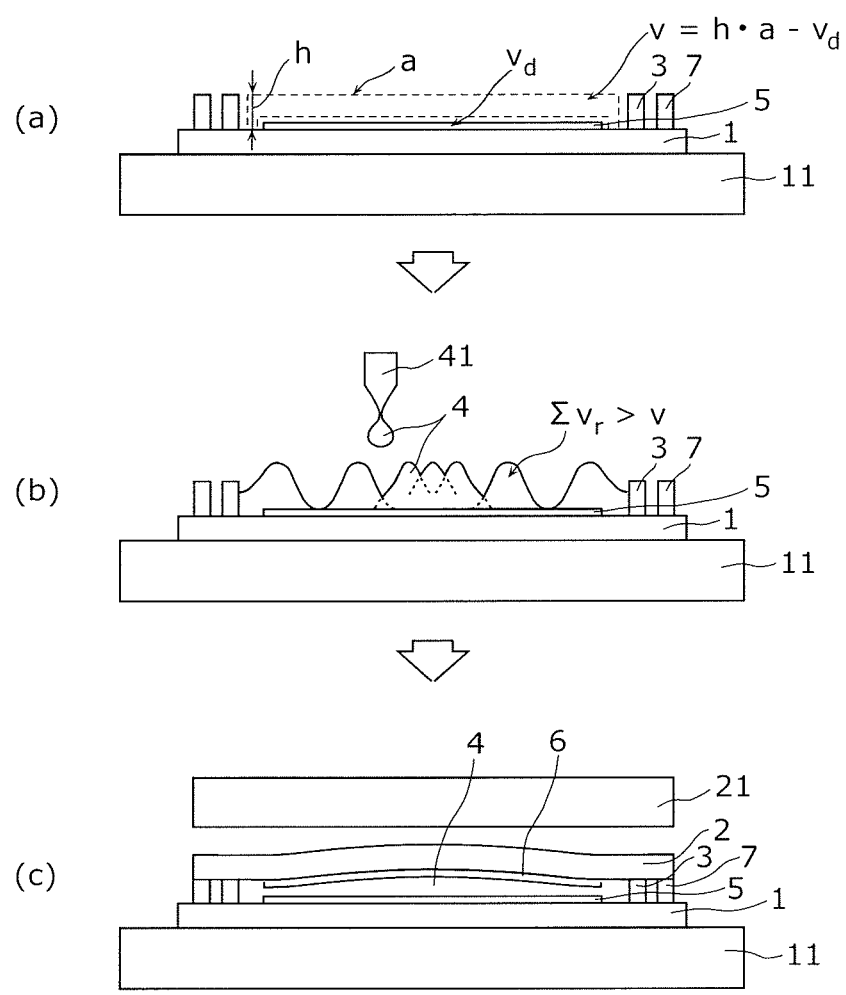
FIG. 5 is a process chart illustrating, in (a) to (c), an example of a process of a display panel manufacturing method according to a modification.

FIG. 5 is a process chart illustrating, in (a) to (c), an example of a process of a display panel manufacturing method according to Modification 1.

In forming of the sealing material 3, a sealing material 7 is formed at an outer periphery of the sealing material 3 ((a) in FIG. 5). In placing of the resin 4, with reference to the inner sealing material 3 as in Embodiment above, the resin 4 is placed in the inside region of the sealing material 3 on the main surface of the substrate 1. The resin 4 is placed in an amount that is greater than a capacity of an open space above the main surface of the substrate 1 and defined by the surrounding sealing material 3 ((b) in FIG. 5). After that, in bonding of the substrate 1 and the substrate 2 via the sealing material 3, a display panel which has two sealing materials, namely, the sealing material 3 and the sealing material 7 is completed ((c) in FIG. 5).

Furthermore, for example, in Modification 2, the sealing material 3 and the resin 4 are placed on the substrate 2 instead of the substrate 1, and the substrate 2, on which the sealing material 3 and the resin 4 are placed, and the substrate 1 are bonded.

Figure 6:
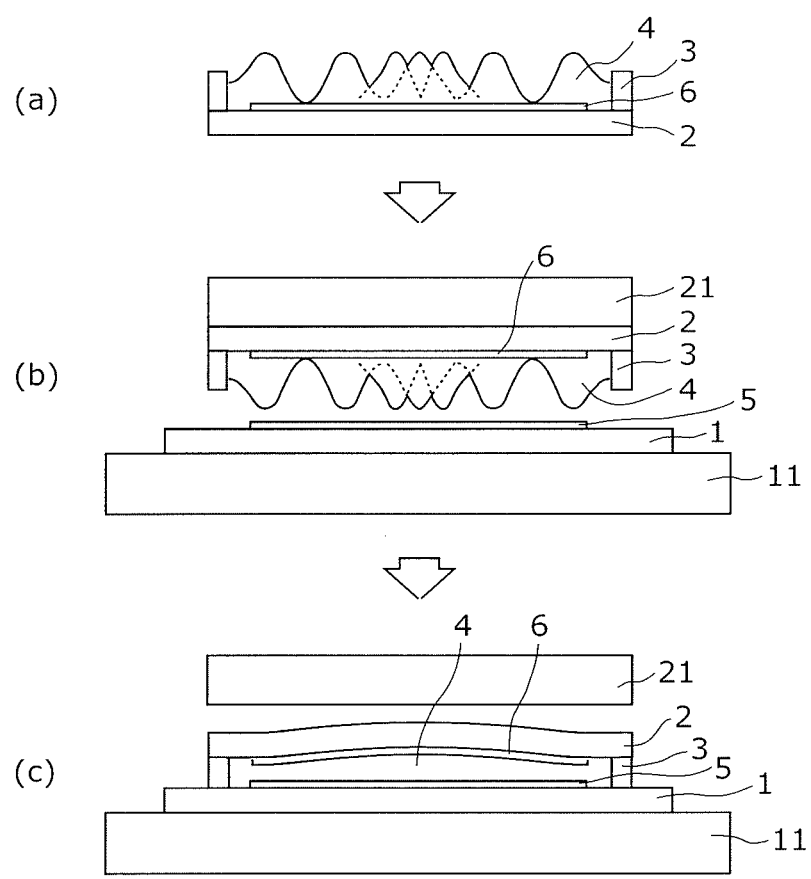
FIG. 6 is a process chart illustrating, in (a) to (c), an example of a process of a manufacturing method of a display panel according to a modification.

FIG. 6 is a process chart illustrating, in (a) to (c), an example of a process of a manufacturing method of a display panel according to Modification 2. Here, the substrate 1 and the substrate 2 are examples of the second substrate and the first substrate, respectively.

In preparing of the substrate 2, on the substrate 2 that is, for example, made of glass, the display function unit 6 in which a plurality of color filters are arranged, for example, is formed. With this, the substrate 2 is configured as the color filter substrate of the display panel.

In forming of the sealing material 3, the sealing material 3 is formed in a region surrounding the display function unit 6 of the substrate 2, thereby forming, above the main surface of the substrate 2, an open space having an open top and sides surrounded by the sealing material 3.

In placing of the resin 4, the resin 4 is placed in an amount that is greater than the capacity of the open space in the inside region of the sealing material 3 on the main surface of the substrate 2.

With the aforementioned process, the substrate 2 on which the sealing material 3 and the resin 4 are placed is completed ((a) in FIG. 6).

In bonding of the substrate 1 and the substrate 2, for example, the substrate 2 is held by an upper substrate stage such as the suction chuck 21 in such a way that the display function unit 6 faces the substrate 1, and carried above the substrate 1 ((b) in FIG. 6). Subsequently, after each of the color filters of the display function unit 6 is aligned with a corresponding one of the pixel units of the display function unit 5, the substrate 2, the resin 4, and the sealing material 3 are placed on the substrate 1.

The substrate 2, the resin 4, and the sealing material 3 are placed on the substrate 1 in a vacuum. Subsequently, after the substrate 1 and the substrate 2 are exposed to the atmospheric pressure or while the substrate 1 and the substrate 2 are gradually being exposed to the atmospheric pressure, the upper substrate stage is removed from the substrate 2 ((c) in FIG. 6). By doing so, the substrates 1 and 2 as a whole are pressed down by returned air pressure.

The placed substrate 2 becomes outwardly convex where the air pressure and the repulsive force of the resin 4 caused by being pressed down by the air pressure are balanced. Therefore, the closed space surrounded by the substrate 1, the sealing material 3, and the substrate 2 is filled with the resin 4 in an amount that is greater than the capacity of the open space.

After the resin 4 is cured, the display panel according to Embodiment is completed. This display panel has a similar shape as the display panel 8 illustrated in FIG. 4, and warp of the display panel is reduced.

Figure 7:
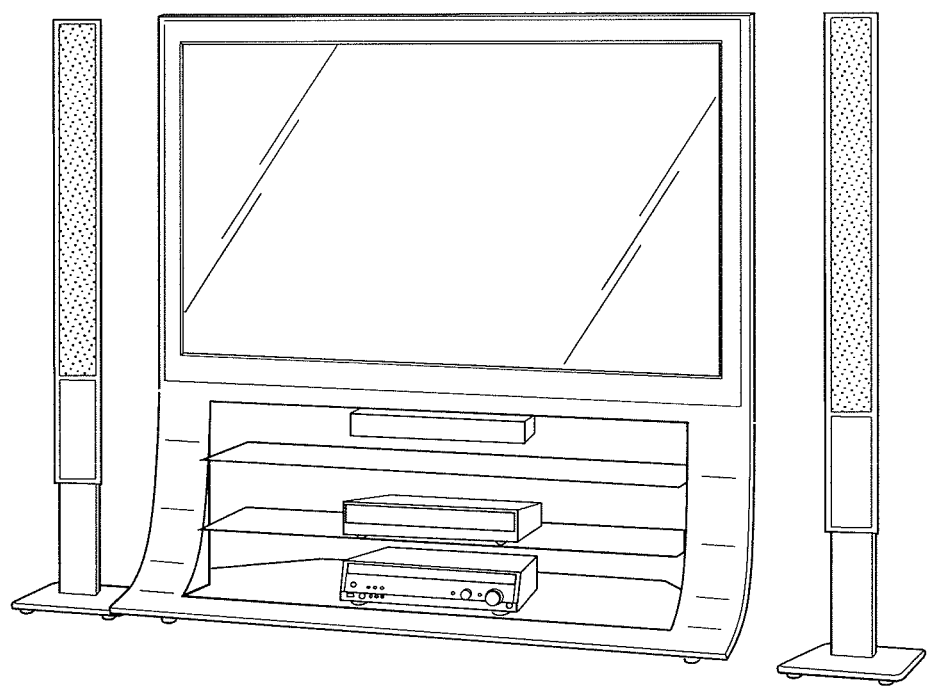
FIG. 7 is a diagram illustrating an example of an external view of a display apparatus according to Embodiment.

FIG. 7 is an external view illustrating a television receiver which is an example of a display apparatus including the display panel 8. With the use of the display panel 8, a display apparatus that can be manufactured with high productivity can be realized.

INDUSTRIAL APPLICABILITY

The present invention is applicable to display panels such as organic EL display panels and liquid crystal display panels.

The invention claimed is:

1. A display panel manufacturing method comprising:
   preparing a first substrate having a main surface on a part of which a display component provided;
   providing a sealing material in a region of the first substrate surrounding the display component provided on the main surface of the first substrate;
   placing resin in an inside region of the sealing material on the main surface of the first substrate, the resin being placed in an amount that is greater than a capacity of an open space surrounded by the sealing material above the main surface of the first substrate; and
   bonding the first substrate and a second substrate via the sealing material to provide a closed space surrounded by the sealing material with the resin provided in the closed space.

2. The display panel manufacturing method according to claim 1,
   wherein in the placing of the resin, the capacity of the open space is obtained by subtracting a volume of the display component from a volume obtained by multiplying an area of the region surrounded by the sealing material on the main surface of the first substrate by a height of the sealing material.

3. The display panel manufacturing method according to claim 1,
   wherein in the preparing of the first substrate, either (i) a plurality of thin film transistors (TFTs) and a plurality of display elements or (ii) a plurality of color filters are provided on the main surface of the first substrate as the display component.

4. The display panel manufacturing method according to claim 1, further comprising:
   holding one of the first substrate and the second substrate at level by a plurality of holders after the bonding of the first substrate and the second substrate; and
   curing the resin in a state where the one of the first substrate and the second substrate is held at level.

5. The display panel manufacturing method according to claim 4,
   wherein in the holding of one of the first substrate and the second substrate at level,
   the one of the first substrate and the second substrate is held by a greater number of the plurality of holders at a periphery than at a center of the one of the first substrate and the second substrate.

6. The display panel manufacturing method according to claim 1,
   wherein in the placing of the resin, the amount of the resin to be placed is greater than the capacity of the open space by not more than six times.

7. The display panel manufacturing method according to claim 1,
   wherein in the placing of the resin, the resin is placed by being dropped on the inside region of the sealing material on the main surface of the first substrate.

8. The display panel manufacturing method according to claim 1,
   wherein in the placing of the resin, a greater amount of the resin is placed at a center than at a periphery of the first substrate.

9. The display panel manufacturing method according to claim 1, further comprising
   fixing the second substrate in a predetermined position relative to the first substrate after the second substrate is placed.

10. The display panel manufacturing method according to claim 1,
wherein in the providing of the sealing material, another sealing material is provided at an outer periphery of the sealing material.

11. The display panel manufacturing method according to claim 1, wherein the capacity of the open space is a volume of the inside region provided by the sealing material and the main surface of the first substrate minus a volume of the display component.

12. The display panel manufacturing method according to claim 11, wherein the amount of the resin placed in the inside region of the sealing material is a sum of resin volume in a semi-solid state, the sum of resin volume being greater than the capacity of the open space.

13. The display panel manufacturing method according to claim 1, wherein the amount of resin placed in the inside region of the sealing material is an amount sufficient to create a positive pressure when the closed space is provided.

* * * * *